(12) United States Patent
Anderson et al.

(10) Patent No.: US 7,938,513 B2
(45) Date of Patent: May 10, 2011

(54) HEATER CHIPS WITH SILICON DIE BONDED ON SILICON SUBSTRATE AND METHODS OF FABRICATING THE HEATER CHIPS

(75) Inventors: Frank Edward Anderson, Sadieville, KY (US); David Laurier Bernard, Lexington, KY (US); Paul William Dryer, Lexington, KY (US); Burton Lee Joyner, II, Lexington, KY (US); Andrew Lee McNees, Lexington, KY (US); Timothy Lowell Strunk, Georgetown, KY (US); Carl Edmond Sullivan, Stamping Ground, KY (US)

(73) Assignee: Lexmark International, Inc., Lexington, NY (US)

( * ) Notice: Subject to any disclaimer, the term of this patent is extended or adjusted under 35 U.S.C. 154(b) by 477 days.

(21) Appl. No.: 12/101,215

(22) Filed: Apr. 11, 2008

(65) Prior Publication Data

US 2009/0256891 A1    Oct. 15, 2009

(51) Int. Cl.
*B41J 2/05*   (2006.01)
*B21D 53/76*  (2006.01)

(52) U.S. Cl. ........................................ 347/65; 29/890.1

(58) Field of Classification Search ............... 347/20, 347/40, 56, 61, 63, 65; 29/890.1
See application file for complete search history.

(56) References Cited

U.S. PATENT DOCUMENTS

| 6,402,301 | B1  | 6/2002 | Powers et al. |
| 6,502,926 | B2  | 1/2003 | Cook et al. |
| 6,890,067 | B2* | 5/2005 | Hock et al. ........................ 347/71 |
| 7,109,092 | B2  | 9/2006 | Tong |

\* cited by examiner

*Primary Examiner* — An H Do

(57) ABSTRACT

A heater chip has a substrate and at least one die, made of silicon, and a bond non-adhesively attaching them. The substrate, thick enough to resist bowing, has ink supply vias from back to front surfaces. The die has ink flow vias from back to front surfaces and circuitry including heater elements adjacent the front surface interspersed with ink flow vias. The at least one die is superimposed on the substrate such that ink supply vias of the substrate align with ink flow vias of the die and portions of substrate front surface and die back surface are aligned, disposed adjacent and facing one another. The bond formed between substrate and die facing surface portions is hermetic and equal in strength to a Si—O bond. By separate processing of carrier and device wafers, size and features of substrate and die can be tailored to provide a desired heater chip construction.

20 Claims, 5 Drawing Sheets

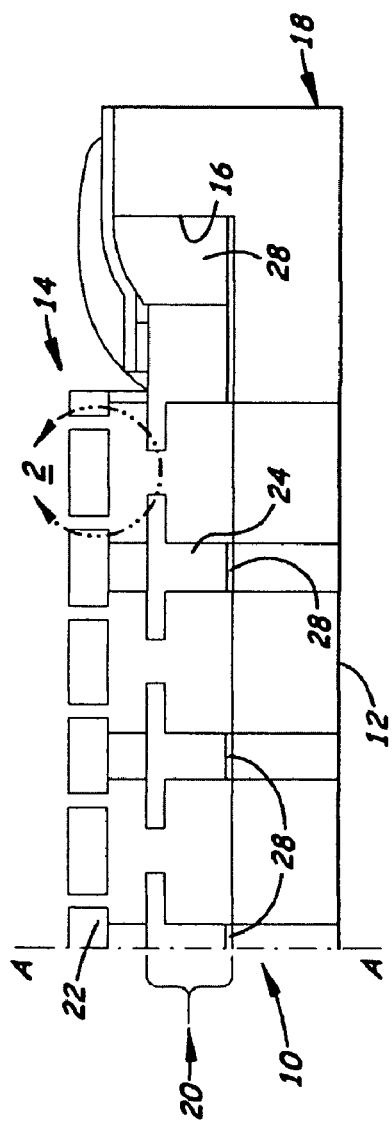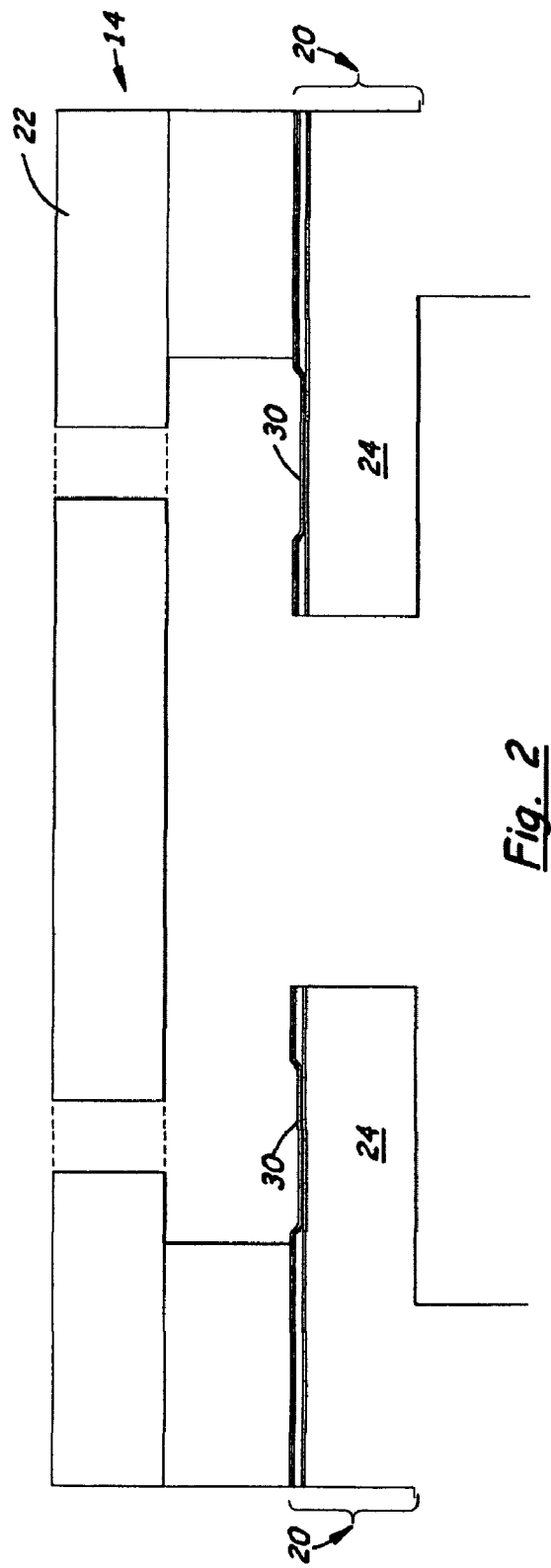

HEATER CHIPS WITH SILICON DIE BONDED ON SILICON SUBSTRATE AND METHODS OF FABRICATING THE HEATER CHIPS

CROSS REFERENCE TO RELATED APPLICATION

This patent application is related to the U.S. patent application Ser. No. 11/848,246, filed Aug. 31, 2007, entitled "Micro-Fluid Ejection Heads And Methods For Bonding Substrates To Supports" and assigned to the assignee of the present application.

BACKGROUND

1. Field of the Invention

The present invention relates generally to fluid ejection modules and, more particularly, to a heater chip for an inkjet printhead chip module having a silicon die bonded on a silicon substrate and methods of fabricating the heater chip.

2. Description of the Related Art

A thermal inkjet printhead is used in a variety of products, such as printers, copiers, faxes and the like, to form and propel drops of ink onto a sheet of print medium, such as paper. In general, an image is produced by the ink drops being emitted from the printhead at precise moments such that they impact the print medium at a desired location. The printhead is supported by a movable carriage within the product and is caused to reciprocate relative to the advancing print medium. It emits the ink drops at times pursuant to commands of a microprocessor or other controller. The timing of the ink drop emissions corresponds to a pattern of pixels of the image being printed.

One thermal inkjet printhead of a conventional design used in such products is illustrated diagrammatically (not to scale) in FIG. 1, with an enlarged fragment of the design illustrated diagrammatically in FIG. 2. The printhead 10 has a chip module 14 composed of a heater chip 20, a nozzle plate 22 attached to or integrated with the heater chip 20, and an input/output connector (not shown), such as a tape automated bond (tab) circuit, for electrically connecting the heater chip 20 to the printer during use. The heater chip 20 has a single silicon substrate 24 seated within and adhesively bonded at 28 to the recessed mouth portion 16 of the bottle 18 on the base plate 12 thereof. The heater chip 20 also has electrical circuitry which includes a plurality of electrical logic components (not shown) and resistors or heater elements 30, as seen in FIG. 2, built on the silicon substrate 24. Each heater chip 20 of a given printhead chip module 14 is fabricated using conventional microelectronic manufacturing techniques and, more particularly, as part of a multiplicity of heater chips processed on a single silicon wafer following conventional semiconductor processing steps. Thus, it will be understood that the heater elements 30 are an integral part of the upper portion of the silicon substrate 24, i.e. they are part of the electrical device, of the heater chip 20, as seen in FIG. 2.

The conventional design, illustrated in FIGS. 1 and 2 and similarly disclosed in U.S. Pat. No. 6,402,301, which is hereby incorporated by reference in its entirety, is effective for today's print quality demands; however, it is apparent that the system described above has print quality limitations, invites long-term corrosion issues, and is less than simple to manufacture. The shortcomings of the conventional design insofar as they affect print quality relate primarily to ink drop misdirection and ink drop size.

Regarding ink drop misdirection, anomalies which cause it are ones that adversely affect nozzle planarity, bore angle of nozzle sidewalls, ink drop velocity, heater/nozzle plate alignment, and dimensional relationships between components. Nozzle planarity determines the direction the ink is dispensed (i.e. drop misdirection). If the nozzle plate is warped or bowed, the desired direction of the ink-jetting is compromised. Nozzle planarity is affected by a mismatch of the coefficient of thermal expansion (CT) between the base plate of the ink bottle and the silicon substrate of the heater chip, between components of the chip module itself, and between the die bond adhesive layer, encapsulant material and the heater chip. Further affecting nozzle planarity are planarity of the base plate in the bottle, non-uniform deposition of either the FF material or a photo-imageable nozzle plate layer impacting formation of the nozzle holes, and sagging of the nozzle plate into the via due to lack of support over the via causing misdirection of nozzle holes.

Bore angle, the angle of the sidewalls of the nozzle holes through the nozzle plate, is ideal when it is reentrant, i.e. a narrow opening at the surface of the nozzle plate over a wider opening at the base. Current technologies are severely limited in their ability to repeatably produce this feature. Repeatable bore angle is fundamental to limiting ink jetting misdirection and drop velocity. Ink drop velocity is adversely affected by distortion of the dimensions of the heater elements and the size of the ink ejection chambers. Heater size is limited by the heater chip surface space.

The heater chip/nozzle plate alignment in the chip module is affected by how well the nozzle plate is aligned with the heater elements, which is proving to be very difficult to accomplish. Also, expansion and contraction of the nozzle plate resulting from other wet and dry processing will affect this alignment. Anomalies affecting dimensional relationships, such as X-spacing, Y-spacing, Z-height, skew and tilt, are the CTE mismatch of the base plate and substrate, the flatness of the base plate, the repeatability and precision of tab bond and tab attach, and the CTE mismatches between heater chip/die bond adhesive material.

Thus, there is a need for an innovation to overcome the above-mentioned shortcomings of the conventional design of the printhead chip module so as to reduce the deleterious effects of the printhead chip module design on print quality.

SUMMARY OF THE INVENTION

The present invention meets this need by providing an innovation which allows replacement of the traditional adhesive die bonding of the chip module to the base plate of the plastic ink bottle which required curing at a high temperature causing expansion and contraction cycling during cooling which is a major contributor to poor heater chip and nozzle plate alignment as well as warping and bowing due to mismatch of CTE between components which compromises nozzle plate planarity, resulting in misdirection of ink drop jetting from the nozzle holes. Underlying the innovation of the present invention is the insight that by devising a different construction for the heater chip through a different method for fabricating the heater chip, in which, by separately processing a carrier wafer of silicon for making silicon substrates, to serve the function of base plates, and a device wafer of silicon for making silicon dies, and non-adhesively bonding the carrier and device wafers to one another, and dicing the bonded wafers into the chip modules, the need to utilize an adhesive die bond attachment of the heater chip of the chip module to the plastic base plate of the ink bottle could be eliminated and a suitable non-adhesive mechanical attachment of the heater chip to the ink bottle could be substituted in its place, eliminating the deleterious effects on the heater chip of the adhesive attachment process in terms of warping and bowing which adversely impact print quality. Alternatively, by dicing the device wafer into dies before the bonding thereof to the carrier wafer, bonding the diced dies to the substrates of the carrier wafer and dicing the carrier wafer into substrates laden with plural dies, chip modules are produced having multiple dies.

Other advantages which will become apparent hereinafter relating to cost reduction of printhead chip module fabrication and tailoring of printhead chip module construction for the particular application can also be gained by the insight underlying the present invention of separate processing of carrier and device wafers for respectively making arrays of substrates and dies for bonding together and dicing into chip modules. This allows the relative makeup and size of the substrate and die(s) to be separately tailored for the particular conditions of a given application for meeting the goal of precise construction and operation at low cost while still maintaining or improving print quality.

Accordingly, in an aspect of an embodiment of the present invention, a heater chip for a printhead chip module includes three basic components: first, a substrate made of silicon of a carrier wafer, of a predetermined thickness tailored to resist bowing and containing ink supply vias; second, at least one die (and in some embodiments plural dies) made of silicon of a device wafer separate from the carrier wafer, of a predetermined thickness relative to that of the substrate, containing electrical circuitry including heater elements interspersed with the ink flow vias and being superimposed on the substrate such that the ink flow vias of the die align with the ink supply vias of the substrate and such that respective selected surface portions on the die and substrate align with one another and are disposed adjacent to and facing one another; and, third, a bond non-adhesively formed between the respective facing surface portions on the substrate and die being hermetic and attaching the substrate and die together.

In another aspect of an embodiment of the present invention, the bond between the respective facing surface portions on the substrate and die is formed by low temperature bonding technology wherein a composition is applied on the respective facing surface portions of at least one of the substrate and die enabling the formation of the bond.

In an exemplary embodiment of the present invention, the composition on the respective facing surface portions of the at least one of the substrate and die is a monolayer of an amine functional group adapted to form a covalent bond transforming the substrate and die into a substantially continuous hermetic structure at the respective facing surface portions thereon.

In another exemplary embodiment of the present invention, the composition on the respective facing surface portions of the at least one of the substrate and die is a solution of 2% TMAH (tetramethylammonium hydroxide) adapted to form by a low temperature bonding technique a substantially hermetic polymerized silicon oxide bond between the substrate and die at the respective facing surfaces thereon.

In another aspect of an embodiment of the present invention, a method for fabricating a heater chip for use in a printhead chip module includes: processing a first blank wafer composed of silicon into a processed carrier wafer containing an array of silicon substrates of a predetermined size tailored to resist bowing; processing a second blank wafer composed of silicon into a processed device wafer containing an array of silicon dies of a predetermined size relative to that of the substrate; preparing respective selected surface portions of at least one of the processed carrier and device wafers for subsequent bonding together; aligning the separately processed carrier and device wafers with one another at the respective facing surface portions; and non-adhesively and hermetically bonding the aligned carrier and device wafers to one another at the respective prepared facing surface portions. The bonded carrier and device wafers are then diced into heater chips which each has a single silicon die bonded on each silicon substrate. Alternatively, dicing at least with respect to the processed device wafer can take place before the preparing, aligning and bonding steps where the objective is to obtain plural dies to attach to each substrate on the carrier wafer. Then, after the preparing, aligning and bonding steps are performed, resulting in the attachment of the desired plural dies to individual substrates on the carrier wafers, dicing of the individual substrates laden with the plural dies takes place.

Thus, the heater chip and its fabrication methods of the present invention provide a solution to the aforementioned problems associated with the prior art printhead chip module design in that the necessity of an adhesive die bond attachment of the heater chip of the chip module to the ink bottle is obviated by processing the carrier wafer for substrates and the device wafer for dies separately and then forming a bond between them that is non-adhesive and hermetic in nature and cures at room temperature, which avoids the cycling of expansions and contractions during cooling as occurs in the case of the prior art adhesive die bonding of the prior art heater chip to the ink bottle which is a major contributor to poor chip planarity and reduced print quality. Thus, due to the separate processing of the carrier wafer of an increased size to resist bowing, the necessity to utilize an adhesive die bond attachment of the heater chip of the chip module to a plastic base plate of an ink bottle, if desired, to complete assembly of the printhead chip module is avoided and substitutable in its place is a non-adhesive attachment of the heater chip to the ink bottle.

Various alternative embodiments, enhancements and other aspects of the heater chip and its fabrication method of the present invention that are disclosed hereinafter allow the balancing of tradeoffs between chip size, performance requirements, industry cost reduction trends and other factors so as to allow tailoring of heater chip and silicon substrate parameters to achieve a low-cost and precise construction that provides a given ink flow rate into the smaller spaces of one or more miniaturized heater chips.

BRIEF DESCRIPTION OF THE DRAWINGS

Having thus described the invention in general terms, reference will now be made to the accompanying drawings, which are not drawn to scale, and wherein:

FIG. 1 is a sectional diagram of half of a prior art chip module having a heater chip constructed in accordance with conventional semiconductor fabrication processes, the missing half being a mirror image of the illustrated half meeting at plane A-A.

FIG. 2 is an enlarged fragmentary sectional diagram of a region of the prior art chip module substantially enclosed by a circle 2 in FIG. 1.

Figure 3:
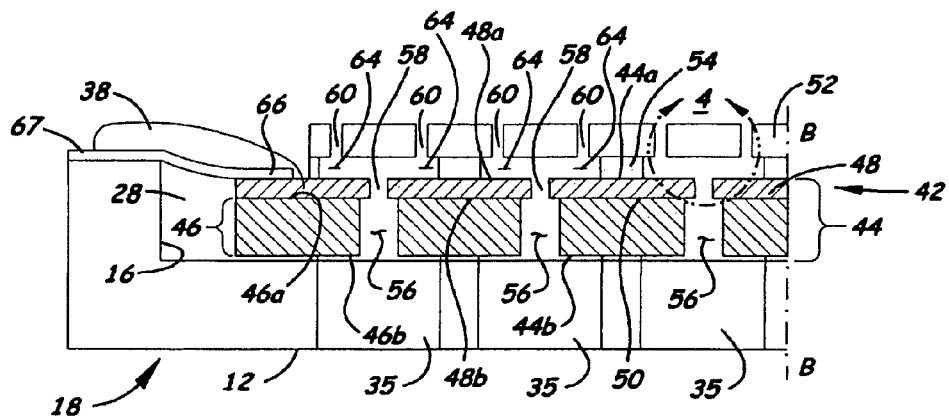

FIG. 3 is a sectional diagram of half of a chip module having a heater chip of the present invention and constructed in accordance with the fabricating method of the present invention, the missing half being a mirror image of the illustrated half meeting at plane B-B.

Figure 4:
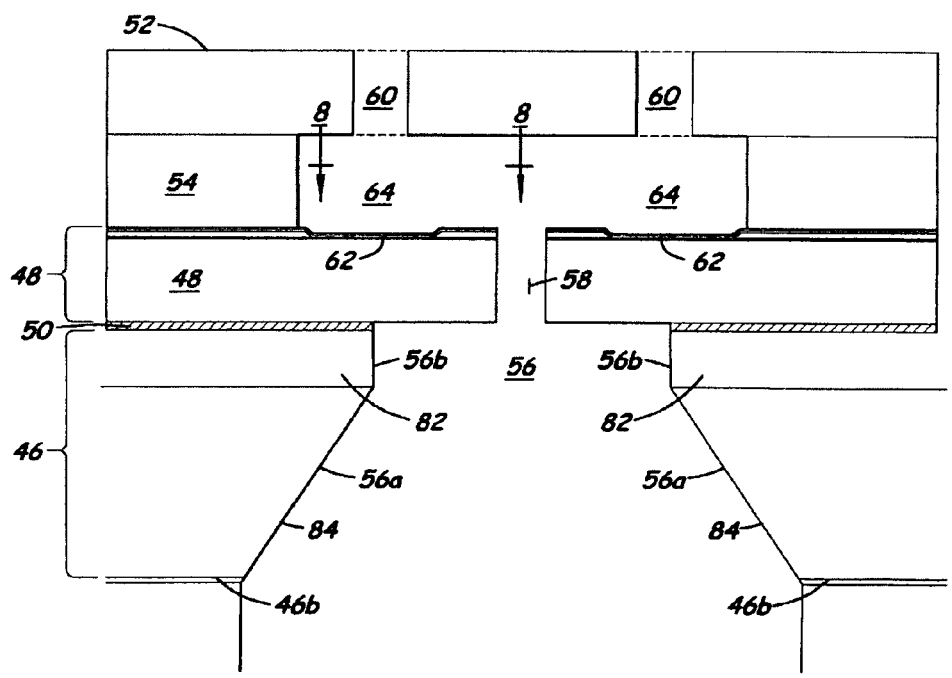

FIG. 4 is an enlarged fragmentary sectional diagram of a region of the chip module of the present invention as substantially enclosed by a circle 4 in FIG. 3.

Figure 5:
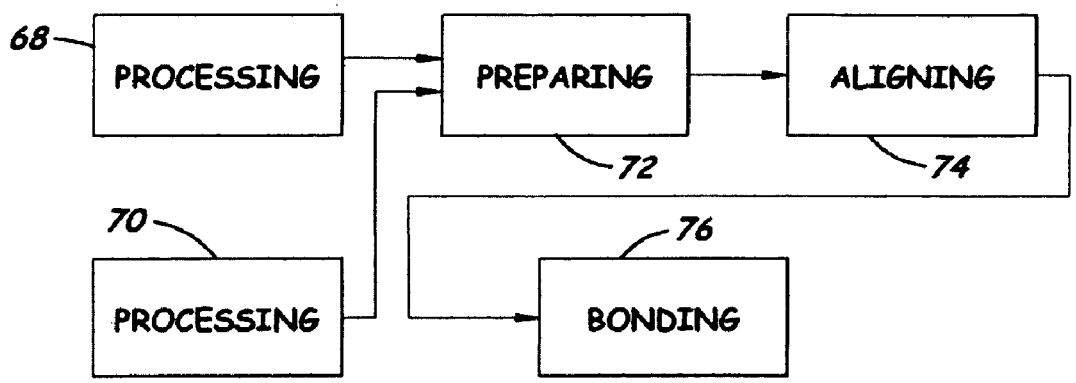

FIG. 5 is a flow diagram of an embodiment of the method for fabricating a heater chip in accordance with the present invention.

Figure 6:
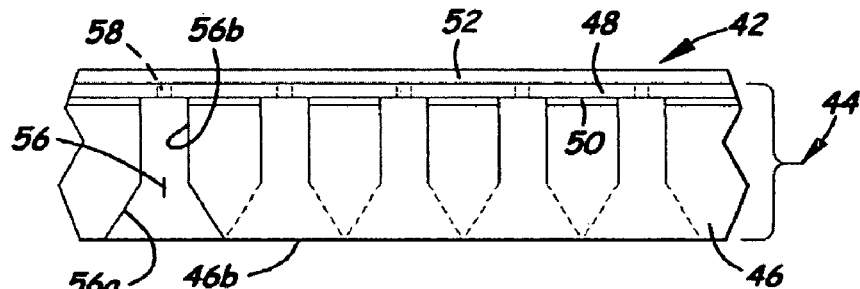
Figure 7:
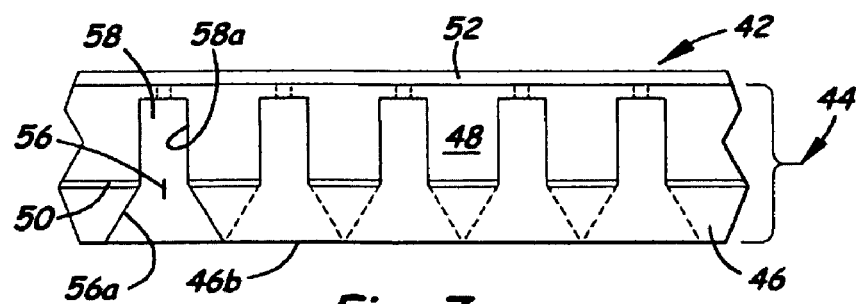

FIGS. 6 and 7 are respective fragmentary sectional diagrams of alternative embodiments of the heater chip of the present invention in relation to relative substrate and die thicknesses and relative portions of the ink supply and flow vias through them.

Figures 8A, 8B, 8C:
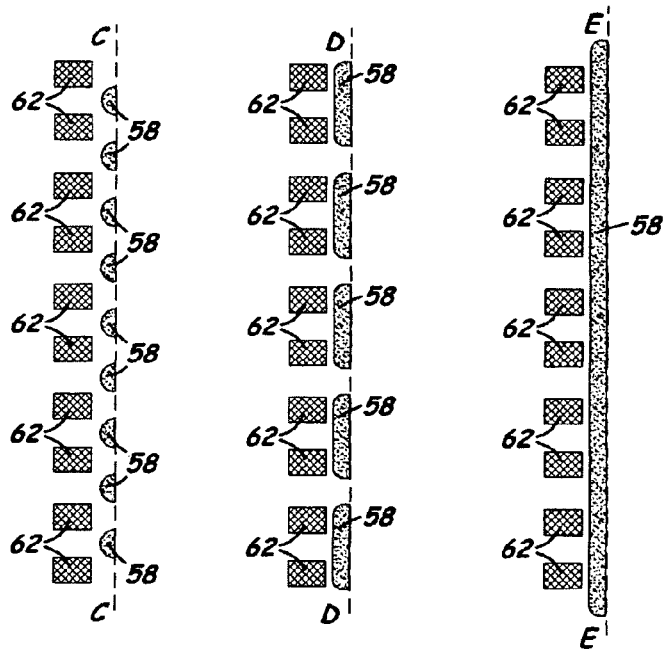

FIGS. 8A-8C are diagrammatic layout views of halves of different possible cross-sectional configurations of etched vias, as seen along line 8-8 of FIG. 4, that can be utilized in the heater chip of the present invention, each missing half being a mirror image of the illustrated half meeting at planes C-C, D-D and E-E respectively.

Figure 9:
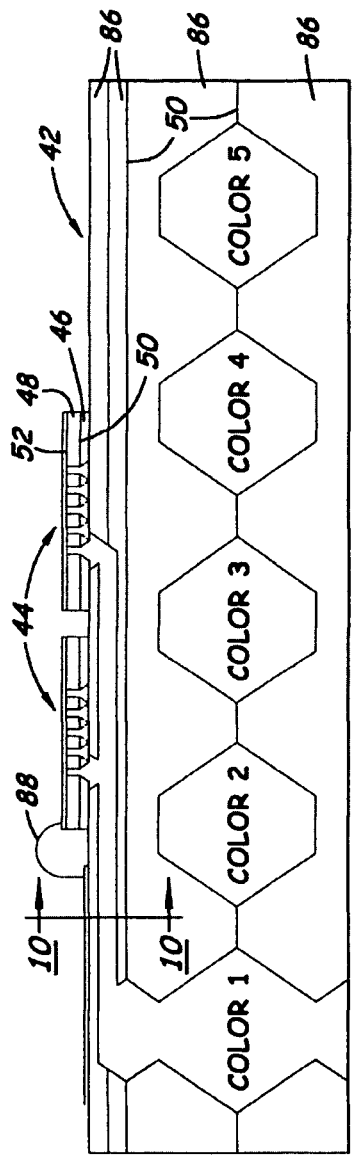

FIG. 9 is a sectional diagram of one embodiment of a heater chip having multiple dies bonded on a substrate having an ink flow system manifold made up of multiple silicon layers.

Figure 10:
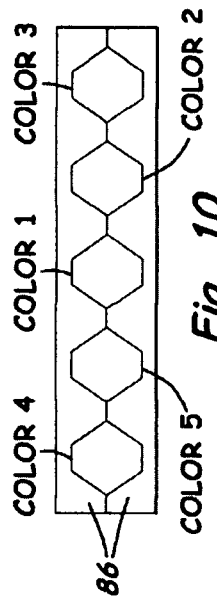

FIG. 10 is an enlarged fragmentary sectional diagram of a view taken along line 10-10 of FIG. 9 showing plural ink supply channels for different ink colors formed between adjacent silicon layers making up the substrate of a heater chip.

Figure 11:
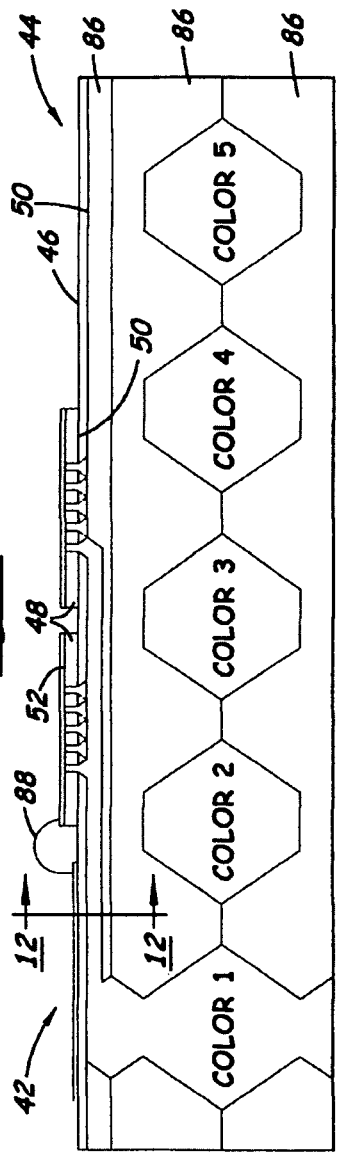

FIG. 11 is a sectional diagram of another embodiment of a heater chip similar to that of FIG. 9 providing a page wide printing construction.

Figure 12:
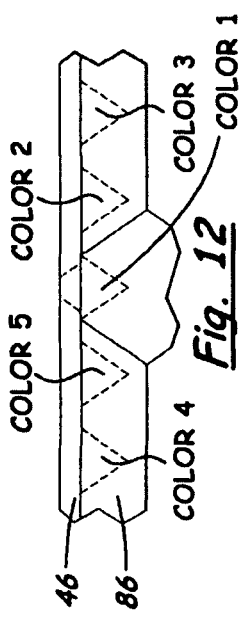

FIG. 12 is an enlarged fragmentary sectional diagram of a view taken along line 12-12 of FIG. 11 showing the same as that with respect to FIG. 10.

Figure 13:
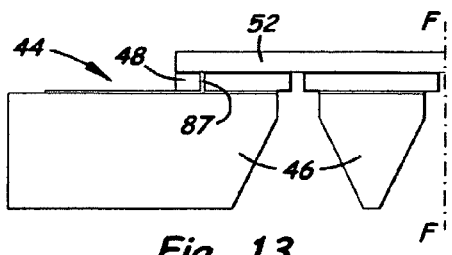

FIG. 13 is an enlarged diagram of an exemplary embodiment of half of a heater chip having metal-filled vias for making electrical connections between the electronic circuitry of the heater chip and the tab circuitry of the chip module, the missing half being a mirror image of the illustrated half meeting at plane F-F.

Figure 14:
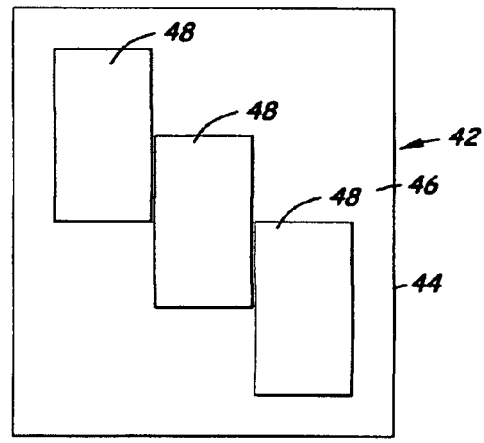

FIG. 14 is a plan view of a multi-component heater chip of the present invention having plural dies arranged in a staggered fashion on a single substrate and constructed in accordance with the method of the present invention.

DETAILED DESCRIPTION

The present invention now will be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Like numerals refer to like, comparable or corresponding elements throughout the views.

Also, it should be understood that the invention applies to any micro-fluid ejection device, not just to thermal inkjet heater chips. While the embodiments of the invention will be described in terms of a thermal inkjet printhead, one of ordinary skill will recognize that the invention can be applied to any micro-fluid ejection system.

Further, it should be understood that many of the embodiments of the invention employ low temperature bonding technology which is a generic term that includes within its scope known processes like thermal fusion, chemical surface treatments like those offered by Ziptronix and TMAH, and eutectic gold to silicon bonding. The Ziptronix technique is disclosed in U.S. Pat. No. 7,109,092 to Tong, assigned to Ziptronix, Inc., the disclosure of which patent is incorporated herein by reference.

Referring now to FIGS. 3 and 4, there is illustrated in a diagrammatic form a chip module 42 which includes a heater chip 44 having a basic three-component construction in accordance with one aspect of the present invention and also being constructed in accordance with a fabrication method constituting another aspect of the present invention. The three-component construction of the heater chip 44 is provided by a substrate 46 composed of silicon of a carrier wafer, having a predetermined thickness, and located at a back portion of the heater chip assembly 44, a die 48 composed of silicon of a device wafer separate from the carrier wafer, having a predetermined thickness relative to that of the substrate 46, and located at a front portion of the heater chip 44, and a bond 50, non-adhesive and hermetic in nature, formed and located between the substrate 46 and die 48 so as to attach them to one another. Together with the heater chip 44, the chip module 42 also includes a nozzle plate 52 attached to or integrated with the heater chip 44, a flow feature (FF) material 54 disposed between the nozzle plate 52 and the die 48, and an input/output connector (not shown), such as a tape automated bond (tab) circuit, for electrically connecting the heater chip 44 of the chip module 42 to the printer during use. The chip module 42 is shown seated within the recessed mouth portion 16 of the bottle 18.

The heater chip 44 also is provided with a plurality of spaced apart ink supply vias 56 penetrating through the substrate 46 between its front and back surfaces 46a, 46b and a plurality of spaced apart ink flow vias 58 penetrating through the die 48 between its front and back surfaces 48a, 48b. The ink flow vias 58 of the die 48 are aligned with the ink supply vias 56 of the substrate 46 to fluidly connect a supply of ink from the ink channels 35 of the bottle base plate 12 through the ink supply vias 56 of the substrate 46 to a plurality of nozzle holes 60 formed through the nozzle plate 52 of the chip module 42.

The heater chip 44 further is provided with electrical circuitry including a plurality of electronic logic components (not shown) and resistors or heater elements 62, as seen in FIG. 4, interspersed with the multiple ink flow vias 58. The flow feature (FF) material 54 deposited on the front surface 48a of the die 48 of the heater chip 44 overlies the heater elements 62 and the other electronics components built on the die 48, as seen in FIG. 4. The FF material 54 has ink ejector chambers 64 formed therein which interconnect and establish flow communication of ink from the ink flow vias 58 of the heater chip die 48 to the ink nozzle holes 60 of the nozzle plate 52, again the ejector chambers 64 are not directly above the ink flow vias 58, but are located outboard of them. Alternatively, the nozzle plate 52 and FF material 54 could be an ablated film where the two are integrated into a monolithic layer, in this case a polyimide. The heater elements 62 are arrayed next to the ink flow vias 58 to provide thermal energy that causes vaporization of the ink into bubble-like drops of ink that are discharged from ejection chambers 64 through the nozzle holes 60 onto the print medium. The chip module 42 also has tab pads 66 on the perimeter of the front surface 48a of the die 48 of the heater chip 44 which are used to power the heater elements 62 by enabling a flow of electrical current through them. Each tab pad 66 on the heater chip 44 is connected to an electrical lead 67 of a corresponding tab circuit connection, tab trace, and electrical connection to the printing device.

From the foregoing description, it can be readily appreciated that a significant difference of the chip module 42 of FIGS. 3 and 4 of the present invention from the prior art chip module 14 of FIGS. 1 and 2 is the above-described basic three-component construction of the heater chip 44 of the chip module 42, comprising the substrate 46 and at least one die 48, both composed of silicon but of different wafers, and a bond 50, non-adhesive and hermetic in nature, formed therebetween attaching them together. The substrate 46 and die 48 are made in respective carrier and device wafers processed separately and then brought together such that the die 48 is superimposed on the substrate 46 with respective selected back and front surface portions 46a, 48b on the substrate 46 and die 48 disposed adjacent and facing one another. The hermetic non-adhesive bond 50 between the respective carrier and device wafers at the respective selected facing surface portions 46a, 48b on the substrate 46 and die 48 is formed by low temperature bonding technology wherein a composition, for example, a monolayer of an amine functional group or a solution of 2% TMAH, is applied on at least one of the respective selected facing surface portions 46a, 48b which prepares the carrier and device wafers at the respective facing surface portions 46a, 48b of the substrate 46 and die 48 to bond to one another. These compositions each provide a bond that is hermetic in nature, preventing any possibility of ink leakage or absorption of ink between the silicon layers. The monolayer composition at low temperature, such as room temperature, forms a covalent bond 50 between the respective selected surface portions 46a, 48b, thereby transforming the respective selected surface portions 46a, 48b into one substantially continuous hermetic structure, constituting a continuation of the Si—O lattice between the silicon substrate 46 and the silicon die 48 equal in strength to a Si—O bond. The use of a solution of 2% TMAH at a room temperature low pressure process forms a hermetic polymerized silicon oxide bond in bonding silicon and silicon oxides substrates. The latter bonding technique, characterized as low thermal fusion bonding, is disclosed in the pending patent application Ser. No. 11/848,246 cross-referenced above, the disclosure of which is incorporated herein by reference.

The above-described heater chip 44 of the chip module 42 is fabricated in accordance with the method of the present invention which is illustrated in general terms in the flow diagram of FIG. 5. Initially, in PROCESSING steps, as represented by separate boxes 68, 70, blank carrier and device wafers, composed of silicon, are processed separately. The blank carrier wafer after processing contains an array of substrates composed of silicon and of a predetermined thickness tailored to resist bowing. The blank device wafer after processing contains an array of electrical chips or dies composed of silicon and of a predetermined thickness relative to that of the substrates and tailored for the particular application. The carrier wafer also contains alignment elements, fiducials or reference points, which are used at a subsequent ALIGNING step. Next, in a PREPARING step, as represented by box 72, selected surface portions of at least one of the processed carrier and device wafers is prepared, such as coated, with a composition that enables them to bond together at a subsequent BONDING step. Following next, in an ALIGNING step, as represented by box 74, the processed carrier and device wafers are brought into alignment with one another such that the array of dies of the processed device wafer overlies and aligns with the array of substrates of the processed carrier wafer and also such that the prepared surface portions on the processed device wafer, for example, overlie and align with the surface portions on the processed carrier wafer in a facing relationship. Following next, in a BONDING step, as represented by box 76, the aligned and processed device and carrier wafers are brought together where by employing low temperature bonding technology they non-adhesively and hermetically bond to one another at the respective aligned and facing surface portions.

The intended construction of the chip module, that is, whether it will be a single die attached on each substrate or plural dies attached on each substrate, determines where a dicing of the bonded processed carrier and device wafers takes place. For instance, the dicing follows the BONDING step when it is intended that the chip module have a single die on each substrate. Alternatively, dicing of the processed device wafer takes place earlier, before the PREPARING, ALIGNING and BONDING steps, where the objective is to obtain plural dies to attach to each substrate on the carrier wafer. Then, after the PREPARING, ALIGNING and BONDING steps are performed resulting in the attachment of the desired plural dies to individual substrates on the carrier wafer, dicing of the individual substrates laden with the plural dies takes place.

Due to separate processing of the carrier wafer from the device wafer under this method, by using substrates with increased thickness to resist bowing thereof, the necessity to utilize an adhesive die bond attachment of the heater chip of the chip module to a plastic base plate of an ink bottle, if such be desired, to complete assembling of the printhead chip module, is avoided.

More particularly, in the PROCESSING of the blank carrier wafer, as per box 68, initially a surface of a thermal oxide layer on the single carrier wafer is planarized and polished, and then patterned with vias and alignment fiducials (reference points) in streets. One or several (single or multi-via product) fluid supply vias would be formed in the patterned thermal oxide carrier wafer by a variety of existing means: grit blast, water jet, laser, DRIE, or wet etch: whichever is deemed most appropriate to create the desired supply via geometries. The via pattern in the planarized thermal oxide silicon substrate would match the product this carrier wafer was fabricated for, and the alignment fiducials would serve a subsequent aligning step. The thickness of the carrier wafer of the predetermined size would have been preselected such that each substrate in the array on the carrier wafer has a thickness ranging from no less than the thickness of the prior art substrate to a predetermined greater thickness that will benefit chip planarity by resisting bowing. Alternatively, each of the substrates in the array on the carrier wafer could be comprised of more than one polished blank wafer sandwiched and bonded together using a suitable low temperature bonding technique.

In the PROCESSING of the device wafer, as per block 70, the electrical circuitry is conventionally provided at the front side of this wafer. A backside or back surface of this wafer is etched with vias, fluid flow features and a nozzle plate using processes that are known in the art. Backside polishing is required rather than back grind due to the substantially increased flatness that chemically polished wafers offer.

After the PROCESSING of the carrier and device wafers are completed, then next, in the PREPARING step, as per box 72, selected surface portions of at least one of the now processed carrier and device wafers is prepared, such as coated, with a composition that enables them to bond together at the subsequent BONDING step. One of ordinary skill in the art will recognize that the PREPARING step may include any pre-processing steps that may be required for the chosen low temperature bonding technology. In one embodiment, for example, the silicon and the polished back side of the processed device wafer are coated with the amine functional group or the solution of 2% TMAH. After PREPARING the surface portions, next, in the ALIGNING step, as per box 74, the processed carrier and device wafers are brought into alignment with one another. In particular, the device wafer would be aligned to the carrier wafer using any suitable technique, such as by using infra red cameras. Following next, in the BONDING step, as represented by box 76, the aligned and processed carrier and device wafers are non-adhesively and hermetically bonded to one another at the respective aligned and facing surface portions. Specifically, the device wafer is placed on the carrier wafer where it is bonded. As mentioned above, the intended construction of the chip module, that is, whether it will be a single die attached on each substrate or plural dies attached on each substrate, determines where in the method the dicing of the bonded processed carrier and device wafers takes place.

The heater chip 44 of the present invention and method of the present invention for fabricating the heater chip 44, as just described, provide a solution to the problems associated with the prior art in that the non-adhesive and hermetic bond 50 formed between the substrate 46 and die 48 cures at room temperature avoiding the repetitive expansion and contraction cycling during cooling as in the case of the prior art adhesive die bond (of the heater chip 20 to the bottle base plate 12) which is a major contributor to poor chip planarity. The bond 50 between the substrate 46 and die 48 is essentially a continuation of a Si—O lattice and thus, in effect, constitutes a hermetic seal so ink will not leak nor be absorbed between the silicon layers. The substrate 46 has a greater thickness to resist bowing and a potentially large surface area for better die bond adhesion and sealing, if it is still desired to use an adhesive attachment technique to the ink bottle. The use of the substrate 46 with the increased thickness also negates the detrimental effects of die bond and encapsulant induced chip bow and thereby improves substantially the planarity of polymer nozzle plate surface. Further, there is a stress-free bonding since there is bonding of similar materials to one another, a die 48 to a substrate 46 with a Si—O layer. Since the die 48 is placed directly on the front surface 46a of the substrate 46, that can easily be planarized to nanometer flatness by various means of polishing of a thermal oxide layer, the flatness of the printhead chip module 42 will mirror the extreme flatness of the substrate 46. Finally, an improved heat sink is provided by the increase in the mass of silicon in the substrate 46, thereby overcoming the prior art difficulty of heat transfer to occur through the thick insulative material of an adhesive die bond, for example, of approximately 100 μm.

Turning now to FIGS. 6-13, there is illustrated other or further aspects of the present invention relating mainly to different design refinements, tradeoffs and tailoring-type modifications and enhancements that can be made to the components of the chip module 42 in order to attain cost reductions by reductions of their relative sizes while improving manufacturability of operations features and attributes of the components without sacrificing the print quality and speed thereof. Reducing the cost of the printhead chip module 42 in an inkjet printer is of paramount importance. A very useful tool in decreasing the chip module cost is to decrease the size of the nozzle plate 52 and the size of the silicon die 48 of the heater chip 44, thereby decreasing its costs. The cost is reduced with decreased size because more dies are yielded from a given wafer. Some mask steps may have to be added in order to decrease the die size, which will offset the cost savings to some degree. Still, the industry cost reduction trend is to decrease the die size so that more dies are yielded from a given wafer. The silicon die of the heater chip with nozzle plate is the major factor in determining the cost of the chip module, so any reduction in its costs affects the overall printhead cost significantly. But, reducing the size of the silicon die of the heater chip with nozzle plate is constrained because it is also the major factor in determining the quality and speed of printing. So, simply reducing the die length would impact performance requirements. Therefore, to reduce the size of the die and nozzle plate, the width must be decreased while the length should be tailored to the cost/performance requirements of a particular printing application. Also, the construction quality of the die and nozzle plate determines print quality. Therefore, the width must be decreased in a manner that allows precise construction so that print quality is maintained or improved. The design that facilitates shrinking the width of the die must consider how to feed a given ink flow rate into a smaller space. The design should also consider how to scale up to larger print swaths by providing a means to connect several individual dies together precisely on a common substrate. This common substrate must be compatible with silicon both in assembly temperatures and in thermal expansion while in use. Therefore, what is needed in the inkjet industry is a low-cost and precise method that provides ink flow into one or more miniaturized dies of heater chips.

The direct bonding of a silicon die of the heater chip to a silicon substrate as carried out by the present invention provides a low-cost and precise way of providing an ink feed into one or more miniaturized heater chips. The silicon substrate is low-cost because it does not require any electrical function. The carrier wafer will have wet or dry etching processes performed to construct the ink supply channels or vias. The silicon device wafer is direct bonded to the silicon carrier wafer, providing a hermetic seal that does not require adhesives. Without adhesives, the placement of the device wafer onto the carrier wafer will be more accurate and therefore smaller features can be formed. Further, it is possible to precisely attach the device wafer onto the carrier wafer such that more than one die is attached to a given substrate to increase either the print swath or the number of print colors to increase performance. Also, the silicon substrate is a perfect thermal expansion match to the silicon die(s) and provides for a thermal heat sink.

Turning first to FIGS. 6 and 7, there is illustrated two embodiments (not drawn to scale) of how tailoring the components making up the chip module 42 can be implemented, allowing flexibility that is dependent on manufacturing capability. These two embodiments are really alternative embodiments of the present invention in that the relative thicknesses of a silicon substrate 46 and silicon die 48 are modified and portions of the ink supply and flow vias 56, 58 through them are modified.

In the one embodiment of FIG. 6, the thickness of the silicon die 48 (for example, about 150 μm) is more (for example, about 1.5 times greater) than that (for example, about 100 μm) of the substrate 46 (the fluidic manifold). The die 48 has formed therein from its back surface 48b a plurality of lateral ink feed portions 58a (for example, about 75 μm×125 μm, 120 nozzles) of the ink flow vias 58, each having a substantially rectangular configuration.

In the other embodiment of FIG. 7, the thickness of the fluidic manifold, the silicon substrate 46, (for example, about 225 μm) is more (about 9 times greater) than that of the die 48. Formation of forward and lateral feed (or flow) portions 56a, 56b of the ink supply vias 56 is only in the substrate 46, where they have respective flared or funnel and rectangular configurations.

In both embodiments FIGS. 6 and 7 and as shown in greater detail earlier in the enlarged fragment of FIG. 4, the substrate 46 has formed therein extending from its back surface 46b a plurality of forward feed portions 56a (for example, about every 1/10th of an inch apart for 1200 DPI) of the ink supply vias 56, each with a flared or funnel configuration. In FIG. 7, these forward portions 56a extend to the front surface 46a of the substrate 46 where they merge into the lateral feed portions 58a at the back surface 48b of the die 48. In FIG. 7, they merge with the lateral feed portions 56b within the substrate 46. Also, as seen in FIGS. 4 and 7, between each pair of nozzle holes 60, the ink flow via(s) 58 of greatly reduced diameter (for example, about 10 μm×10 μm, 25 μm long) extend through the die 48 of the heater chip 44 so as to link and communicate the ink supply vias 56 of the substrate 46 with each of the ejection chambers 64, as best seen in FIG. 4, formed in the FF material 54 between the die 48 and the nozzle plate 52. Each ejection chamber 64 is aligned with and located behind the pair of spaced apart nozzle holes 60 and extends laterally in opposite directions beyond the pair of holes 60. The nozzle plate 52 can be made of polymer, silicon, MEMS, or other suitable organic or inorganic materials known in the art. The direct bond is formed by the bonding oxide layer 50 between the silicon substrate 46 and the silicon die 48 of the heater chip 44.

Thus, basically FIG. 6 shows the chip module 42 with the lateral ink feed in the die 48, whereas FIG. 7 shows the chip module 42 with the lateral ink feed in the substrate 46. Both FIGS. 6 and 7 have a front wafer, which is primarily the electrical device or die 48, and a back wafer, which is primarily the non-electrical substrate 46. The attributes of the front wafer or die 48, although not so limited, include the following: (1) contains the majority of the electrical function (heater elements, FET, logic, Power, etc.); (2) relatively expensive per unit area due to number of mask steps; (3) would need to be relatively small to optimize yield per wafer (perhaps 0.5" swath with 2 mm width); (4) forward ink feed per chamber formed with DRIE or some other precision process; (5) very thin (on the order of 30 to 50 μm in thickness) to aid in fluid flow; (6) PINP or other MEMS based nozzle plate 52 on the FF material 54 (only seen in FIG. 4) above the die 48; and (7) several configurations of small DRIE ink vias possible, as seen in FIGS. 8A-8C.

The attributes of the back wafer or substrate 46, although not so limited, include the following: (1) only electrical function is optional fan-out wiring from front piece metal vias to wirebond or tab circuit pads; (2) relatively inexpensive per unit area due to minimum number of mask steps; (3) could be long enough for a page-wide printhead, a 200 mm wafer would yield on the order of 50 dies of 8.5" swath; (4) big ink feeds formed from grit blast or other low cost bulk method such as wet or dry etch; and (5) normal thickness, i.e. 300-750 μm or thicker for additional strength during attachment to bottle.

The attributes of the substrate 46 and die(s) 48 together insofar as they permit or promote integration, although not so limited, include the following: (1) direct bonding to attach one or more die(s) 48 to the substrate 46, a semi fab compatible process with hermetic seal and the Ziptronix direct bond technique being one example of a bonding process that can be utilized; (2) plural dies can be joined together end-to-end with no overlap so that width of the substrate is the same as that of the dies; (3) electrical vias line up top to bottom; (4) forward ink feeds in dies line up with appropriate bulk ink feeds in the substrate; (5) die would be standard building block of optimum swath; multiple dies could be mounted on one substrate to achieve a desired swath; and (6) substrate length would be in increments of the die, typical lengths being, for example, one inch for scanning head, four inches for photo, and 8.5 inches for page wide.

For a better understanding of how components making up a chip module can be added, enhanced and/or modified in accordance with the principles of the present invention to meet cost reduction goals without sacrificing, but rather improving, performance, in the following discussion reference will be made to the details of the chip module 42, as shown in FIG. 4. In the diagrammatically illustrated (not to scale) chip module 42 of FIG. 4, the basic three-component approach of the present invention still applies: the substrate 46 and the die 48, both made of silicon but of separate wafers, are attached together non-adhesively at the bond 50 in FIG. 4. The method of bonding can be one currently available in MEMS technology. The die 48 is the main part of the module 42 and is comparable to the current die of FIG. 2 but much smaller in width since the ink flow vias 58 of the die 48 can be made with a width possibly ten times smaller using the DRIE process. The ten times smaller width is calculated with a conservative DRIE aspect ratio of 20:1. With current thickness of 450 μm, it is possible to etch an ink via (or small holes) having a width as thin as 25 μm. In contrast thereto, as seen in FIG. 2 the current ink via width dimension is 250 μm for color. Thus, this smaller DRIE ink via width of 25 μm provides a saving in width of almost a millimeter on every die. Additionally, the die 48 will be smaller in thickness, compared to current dies, to minimize the distance the ink must travel through the small orifice. The ink supply via 56 in the substrate 46 allows the ink flow from the channels 35 in the base plate 12 of the bottle 18 to the die DRIE via 58 to be unrestricted by incorporating a funneling effect, as also seen in FIGS. 6 and 7. This funnel 56a in the via 56 is achieved by employing two wafers 82, 84 to make up the substrate 46 and then by wet etching of the upper one of the two wafers 82 using standard etching processes. The die 48 can be bonded at bond layer 50 to the upper wafer 82 of the substrate 46 by using MEMS wafer bonding technique as described below. The substrate upper wafer 82 can be bonded to the substrate lower wafer 84 or to still another substrate wafer depending on the overall design of the printhead chip module 42.

Next, FIGS. 8A-8C illustrate diagrammatically possible DRIE via cross-sectional configurations in the chip module 42 of FIG. 4. All vias are on the order of 10-25 μm in horizontal width as seen in the view. In FIG. 8A, the DRIE vias 58 are individually of circular configurations and one via feeds several heater elements 62. In FIG. 8B, the DRIE vias 58 are of interrupted oblong configurations and, again, one via feeds several heater elements 62. In FIG. 8C, the DRIE via 58 is a continuous oblong configuration and one via feeds the entire array of heater elements 62.

Wafer bonding in MEMS is a common practice and can be done in several different manners. Satisfactory ways to bond the silicon nozzle plate 52 to the silicon based flow features 54 are: (1) low temperature bonding; and (2) fusion bonding.

One of the several known techniques of low temperature bonding is the Ziptronix direct bonding technique, cited previously. It is performed at room temperature without adhesives, and utilizes standard manufacturing equipment and chemicals typically found in today's merchant foundries. Once activated, Ziptronix wafers have an activation shelf life of several hours, thereby facilitating high-volume, batch-driven production. It is assumed that this process involves some form of chemical-mechanical polishing (CMP) to planarize the substrates before bonding Fusion bonding is a process by which silicon to silicon bonds or silicon oxide to silicon oxide bonds can be made. The process is as follows: The carrier and device wafers are surface treated to insure cleanliness. (Surface treatment is dependent on material set.) Once cleanliness is insured, the two wafers are brought together and aligned. This can be accomplished through a silicon wafer by an IR camera and fiducial. Once the alignment is carried out, the wafers are put together and a pre-bond is made at room temperature using a slight pressure. Next the wafers are inspected for voids. If voids are present, the wafers are re-bonded by another pressure wave. After pre-bonding the bond strength is such that the device can be handled in subsequent steps. Then the device is moved to a vacuum furnace for permanent bonding. In the furnace, temperatures of approximately 120° C. are used. (See Berthold, Jakoby, Vellekoop: "Wafer-to-wafer fusion bonding of oxidized silicon to silicon at low temperatures", Elsevier, Sensors and Actuators A 68 (1998) 410-413.) This is a commercial process that is known in the art and is already done on a manufacturing scale in MEMS fabs.

Referring now to FIGS. 9-14, as well as to FIGS. 8A-8C, for the inkjet printhead chip module 42, some additional or modified steps of the method of fabrication (shown in FIG. 5) according to the present invention are as follows: (1) as before, process a CMOS device wafer so as to provide it with DRIE ink vias (see FIGS. 8A-8C); (2) dice the device wafer into a plurality of dies in preparation for dies-to-carrier wafer bonding; (3) also process the carrier wafer so as to provide it with wet etched (or other preparations, e.g. grit blast) ink via funnel manifold; (4) surface treat the dies and carrier wafer for cleanliness; (5) align, either optically or with IR, the dies and carrier wafer as well as wafer to wafer in case there are plural wafers to make up the substrate; (6) pre-bond and inspect for voids, then re-bond if necessary; and (7) for fusion bonding, grow permanent bonding thermal oxide in low thermal (T) furnace.

Other techniques exist that could be employed in the method of the present invention for bonding of silicon to silicon or silicon to oxide. These include: (1) eutectic gold to silicon bonding; and (2) diffusion bonding. It is also possible to deposit a thin layer of material (i.e. an oxide) through sputtering or chemical-vapor deposition (CVD) techniques that can then be used to form part of the substrate manifold. In this embodiment the thickness of the layer is limited to less than 20 μm. The advantage of oxide is that it can then be utilized to affect a bond to another piece of silicon to complete the manifold. It should be understood that these techniques fall within the scope of the generic term, low temperature bonding technology, which is employed by the invention.

In accordance with the aforementioned additional, enhanced and/or modified steps of the method of fabrication according to the present invention, a variety of different chip module constructions can be realized. One exemplary embodiment, as seen in FIGS. 9 and 10, is a chip module 42 having a plurality of spaced apart multiple heater chips 44 each comprised of a die 48 supported by and attached by a direct bond 50 on a single silicon layer substrate 46. The single layer substrate 46 of each of the heater chips 44 is, in turn, supported by and attached on a stack of multiple silicon layers 86 making up a manifold extension of the substrate 46 defining its ink flow system therein. Another exemplary embodiment, as seen in FIGS. 11 and 12, is a page-wide chip module 42 having a heater chip 44 comprised of a plurality of dies 48 arranged end-to-end and supported by and attached by a direct bond 50 on a single layer substrate 46 which, in turn, is supported by and attached on a stack of multiple silicon layers 86, as in FIG. 9.

Thus, in these other aspects of the present invention, two or more heater chips 44 are aggregated to provide a chip module construction having multiple chips disposed in spaced side-by-side relation as seen in FIG. 9, end-to-end relation as seen in FIG. 11, or staggered relation as seen in FIG. 14, and bonded on individual substrates 46, as seen in FIG. 9 or a common silicon substrate 46, as seen in FIGS. 11 and 14 with many silicon layers 86 forming a manifold constituted by the many layers of silicon etched and joined together to make up an ink flow system. The heater chip may be constructed of one piece or as above two pieces. With the heater chip 44 constructed of two pieces, the bottom substrate 46 can be of page wide dimension with multiple top dies 48 direct bonded thereon. As seen in FIG. 13, electrical metal vias 87 can be provided from topside to bottom of the heater chip 44 to allow electrical connection of chip to tap circuit in place of elevated exposed metal wires 88, as seen in FIGS. 9 and 11, which may affect distance of the nozzle to the page of print medium. The metal via 87 can be made by drilling a hole down through the active die (or device chip) 48 and filling it with metal to allow electrical connection of the device to the tab circuit.

The advantages of these embodiments and aspects of the present invention is hat they allow balancing of tradeoffs between chip size, performance requirements, industry cost reduction trends and other factors so as to allow tailoring of heater chip and substrate parameters to achieve a low-cost and precise construction that provides a given ink flow rate into the smaller spaces of one or more miniaturized heater chips.

The foregoing description of several embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended thereto.

What is claimed is:

1. A heater chip for a micro-fluid ejection head module, comprising:
   a substrate composed of silicon of a carrier wafer, said substrate containing a plurality of fluid supply vias extending therethrough from a back surface to a front surface thereof;
   at least one die composed of silicon of a device wafer separate from said carrier wafer, the die containing a plurality of fluid flow vias extending therethrough from a back surface to a front surface thereof and also containing electrical circuitry including a plurality of heater elements formed near said front surface, said heater elements interspersed with said fluid flow vias, said die being superimposed on said substrate such that said fluid flow vias of said die align with said fluid supply vias of said substrate and such that portions of said back surface on said die and portions of said front surface on said substrate align with one another and are disposed adjacent and facing one another; and
   a bond non-adhesively formed between said respective facing surface portions on said die and said substrate being hermetic in nature and directly attaching said die and substrate together.

2. The heater chip of claim 1 wherein said bond between said respective facing surface portions on said die and substrate is formed by low temperature bonding technology wherein a composition is coated on said facing surface portions of at least one of said die and substrate enabling the formation of said bond.

3. The heater chip of claim 2 wherein said composition is a monolayer of an amine functional group adapted to form a covalent bond transforming said silicon substrate and said silicon die into a substantially continuous structure at said respective facing surface portions thereon.

4. The heater chip of claim 2 wherein said composition is a solution of 2% TMAH adapted to form by a lower thermal fusion bonding technique a polymerized silicon oxide bond between said substrate and die at the respective facing surfaces thereon.

5. The heater chip of claim 1 wherein said thickness of said die is greater than said thickness of said substrate.

6. The heater chip of claim 1 wherein at least some of said fluid supply vias of said substrate each contain a forward feed portion and a lateral feed portion connected with one another and extending from said back surface to said front surface of said substrate.

7. The heater clip of claim 6 wherein said forward feed portion of said fluid supply via has a funnel-shaped configuration and said lateral feed portion has a substantially rectangular configuration.

8. The heater chip of claim 6 wherein at least some of said fluid supply vias of said substrate each contains a forward feed portion extending from said back surface to said front surface of said substrate.

9. The heater chip of claim 8 wherein at least some of said fluid flow vias of said die each contain a lateral feed portion connected with said forward feed portion of said fluid supply via of said substrate at said back surface of said die.

10. The heater chip of claim 1 wherein said substrate is comprised of more than one wafer bonded together.

11. The heater chip of claim 1 wherein a plurality of said dies is bonded to said substrate.

12. The heater chip of claim 11 wherein said dies are either spaced apart from one another on said substrate, or said dies are placed end-to-end with one another on said substrate.

13. The heater chip of claim 11 wherein said bond between said respective facing surface portions on said die and substrate is formed by a low temperature bonding technology, which causes said bond to form substantially instantaneously upon said die meeting said substrate.

14. The heater chip of claim 11 wherein said dies are placed in a staggered relationship to one another on said substrate.

15. A method of fabricating a heater chip for assembly into a micro-fluid ejection head module, comprising:
 processing a first blank wafer of silicon into a processed carrier wafer containing an array of silicon substrates;
 processing a second blank wafer of silicon into a process device wafer containing an array of silicon dies;
 preparing respective selected facing surface portions of at least one of said processed carrier and device wafers for subsequently bonding of said array of silicon dies of said processed device wafer with said array of silicon substrates of said processed carrier wafer;
 aligning said processed carrier and device wafers relative to one another such that said array of silicon dies of said processed device wafer overlie and align with said array of silicon substrates of said processed carrier wafer;
 non-adhesively and hermetically bonding said processed carrier and device wafers directly to one another at said respective prepared facing surface portions thereon; and
 dicing said bonded and processed wafers into heater chips.

16. The method of claim 15 wherein said preparing includes applying to said respective selected facing surface portions a monolayer of an amine functional group adapted to form a covalent bond between said processed carrier and device wafers transforming them into a substantially continuous structure at said respective facing surface portions thereon.

17. The method of claim 15 wherein said preparing includes applying to said respective selected facing surface portions a solution of 2% TMAH adapted to form by a low thermal fusion bonding technique a polymerized silicon oxide bond between said processed carrier and device wafers at said respective facing surface portions thereon.

18. A method of fabricating a heater chip for assembly into a micro-fluid ejection head module, comprising:
 processing a first blank wafer of silicon into a processed carrier wafer containing an array of silicon substrates;
 processing a second blank wafer of silicon into a processed device wafer containing an array of silicon dies;
 dicing said processed device wafer into a multiplicity of silicon dies;
 preparing respective selected facing surface portions of at least one of said processed carrier and said dies for subsequently bonding of plural dies to one of said array of silicon substrates of said processed carrier wafer;
 aligning said processed carrier wafer and said multiplicity of dies relative to one another such that each of said plural silicon dies overlie and align with one of said silicon substrates in said array thereof on said processed carrier wafer;
 non-adhesively and hermetically bonding each of said plural dies directly to said one of said silicon substrates in said processed carrier at said respective prepared facing surface portions thereon; and
 dicing the bonded and processed carrier wafer into heater chips each having plural dies thereon.

19. The method of claim 18 wherein said preparing includes applying to said respective selected facing surface portions a monolayer of an amine functional group adapted to form a covalent bond between said processed carrier and device wafers transforming them into a substantially continuous structure at said respective facing surface portions thereon.

20. The method of claim 18 wherein said preparing includes applying to said respective selected facing surface portions a solution of 2% TMAH adapted to form by a low thermal fusion bonding technique a polymerized silicon oxide bond between said processed carrier and device wafers at said respective facing surface portions thereon.

* * * * *